Dec. 24, 1963 F. ASHWORTH 3,115,423

MANUFACTURE OF PRINTED ELECTRICAL CIRCUITS

Filed June 13, 1955

INVENTOR

Fred Ashworth

ATTORNEYS

United States Patent Office 3,115,423

Patented Dec. 24, 1963

3,115,423
MANUFACTURE OF PRINTED ELECTRICAL CIRCUITS

Fred Ashworth, Sale, England, assignor to Associated Electrical Industries (Manchester) Limited Filed June 13, 1955, Ser. No. 515,148
5 Claims. (Cl. 117—212)

This invention relates to the manufacture of printed electrical circuits and more particularly to printed circuits including both wiring and components such, for example, as resistors.

It is known to construct printed circuits by processes involving bonding a metal foil on to a base surface, printing the required pattern as a resist on to the metal and removing the unwanted metal not underlying the resist, such removal being effected, for instance, by etching with acid. Following such an acid stage the circuit so formed must be dipped in an alkali bath to remove any surplus acid. Whilst processes of this sort are quite satisfactory for producing the actual circuitory connections, i.e. the wiring, complications may arise in forming the components, especially resistances, by such processes. Hitherto, resistances have been constructed by spraying materials such as "Aquadag" on to an insulating backing and subsequently scratching away the edge of the sprayed area to obtain the required resistance value. Alternatively, a separate resistive foil may be employed which is bonded to the foil constituting the circuit connections after this has been formed.

The main object of the invention is to provide an improved process which is both simple and quick to carry out.

According to the present invention, a method of manufacturing printed circuits includes the steps of forming super-imposed layers to constitute the components and connections respectively, by printing a negative mask on to an insulating backing and applying a conducting, resistive, or semi-conducting coating all over so that the coating lies directly on the insulating backing only where said backing is unmasked and exposed, and forming a subsequent layer or layers on to the deposited layer by further printing and coating with sufficient overlap to the previously formed layer or layers to provide electrical connection between the layers where required, the masking material and the unwanted coatings superimposed thereon being removed.

A preferred method of manufacturing printed circuits consists in the steps of printing an insulating base with a negative masking of the desired resistor or semi-conductor areas, coating the exposed surfaces with a resistor or semi-conductor material to a thickness depending on the resistivity required, removing all masking and resistor or semi-conductor material from the masked areas, printing on the insulating base and resistor or semi-conductor areas a second negative masking of the conducting areas, coating the surfaces exposed by the second masking with a metallic conductor to a thickness depending on the conductivity required, and removing the second masking and conductor material from the masked areas.

The term "negative" implies a layer of masking material, for example an ink, which will mask the unwanted areas of the base to prevent metal adhering to these areas, but will leave exposed those areas which represent circuitry so that the metal can be deposited thereon. The masking should be capable of easy removal, for example by a solvent, after deposition of the metal.

Another preferred method of manufacturing printed circuits consists in the steps of printing an insulating base with a negative masking of the desired resistor or semi-conductor and conductor areas, applying a coating of a resistor or semi-conductor material to a thickness depending on the resistivity required, for example by vacuum deposition, printing on the coating of resistor or semi-conductor material a second negative masking of the desired conducting areas, applying a coating of a metallic conductor to a thickness depending on the conductivity required, so as to adhere to the exposed areas of the resistor or semi-conductor material, and removing the masking and any superimposed resistor or semi-conductor and conductor coating from the masked areas. With such arrangements it will be appreciated that removal of the masking and unwanted metal may be carried out at the end of the whole process and it is not necessary to include such steps between the forming of the successive layers.

According to one process for manufacturing wiring and resistors the layer constituting the resistor or resistors is first applied to an insulating backing and a subsequent layer constituting the wiring is then superimposed on the first layer. Preferably in such a case the initial layer which will be relatively thin and of higher resistance, is applied all over the areas to which the subsequent layer will be applied. The resistor areas are then masked and the conductor layer applied to the circuitry areas only. With such an arrangement it will be appreciated that the conductors of the wiring will consist of two layers, i.e. the low resistance layer bonded to the high resistance layer.

In order that the invention may be more clearly understood reference will now be made to the accompanying drawing, in which.

Figure 1:
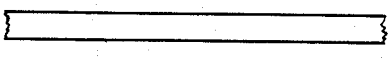
FIG. 1 is an uncoated insulating base.
Figure 2:
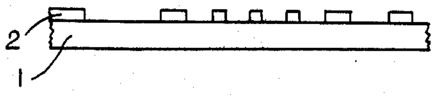
FIG. 2 shows the base printed with the negative of the resistor pattern.
Figure 3:
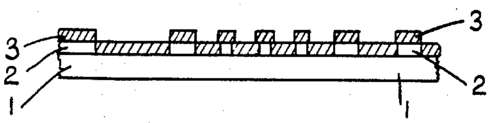
FIG. 3 shows the resistor coating applied.
Figure 4:
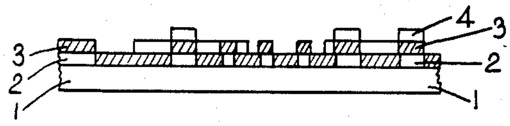
FIG. 4 shows the negative of the conductor pattern printed.
Figure 5:
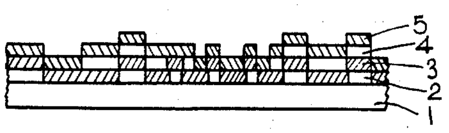
FIG. 5 shows the conductor coating applied.
Figure 6:
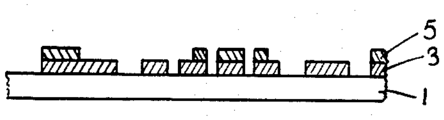
FIG. 6 shows the masking and its superposed metallic layers washed away.
Figure 7:
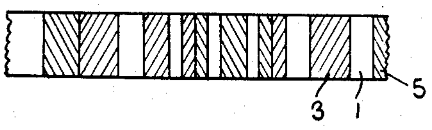
FIG. 7 is a plan view of FIG. 6.

The base 1 is coated with the negative mask 2 to leave exposed the resistor and conductor pattern, and the resistor material 3 is deposited or sprayed over the whole base. Over those parts of the resistor pattern where conductor leads are not wanted the second masking layer 4 is then applied and over the whole surface a copper or other conductor coating 5 is deposited or sprayed to form the conductors.

In some cases it may be undesirable to form the conductors of a double layer, i.e. of resistor and conductor layers, and in such cases it will be necessary to wash away the negative print after depositing the first layer constituting the resistor or resistors and before applying the second print. In such cases the resistor and conductor layers should overlap for at least a short distance so as to ensure electrical connection.

It is obvious that the process may be extended to three or more layers of conducting, semi-conducting (for example selenium, germanium), or resistive materials.

The layer constituting the resistors is preferably a nickel-chromium alloy, and for the conductor layer copper or silver may be used.

It will be noted from the above that in such cases it is preferred to coat the areas forming the conductors first with nickel-chromium and, on top of that, with the conducting metal. The reasons for this are: (*a*) the nickel-chromium layer is usually much thinner than the conductor layer and therefore, to obtain good electrical continuity between the nickel-chromium and the conductor, it is necessary for the conductor layer to overlap the nickel-chromium; and (*b*) the nickel-chromium-insulator bond is often much stronger than the copper-insulator bond, particularly in the case of glass and glazed ceramic.

It should be noted that when only one masking operation is used the nickel-chromium layer must be deposited first as otherwise it will be necessary to have the whole of the underlying layer of conductor metal. It is impossible to form resistors by depositing nickel-chromium on to a conductor layer, as the resistor strips are thereby bypassed electrically by the lower resistance of the conductor metal.

Condensers may be made either by metallising an area of required size on each side of a sheet of insulator, so forming the two plates of the condenser separated by one layer of dielectric; or by metallising two equal areas on one side of the insulator and folding the latter so that the two metal areas are superimposed with two layers of dielectric, or additional layers if necessary, between them; or any other suitable geometrical or spatial arrangement.

An inductance may be formed by printing parallel conductors on a sheet which is then wound on a former, or by printing a helical conducting form on a flat base. Large inductances can be constructed in pancake fashion, i.e. by stacking sheets on each of which a helical conductor is printed. Transformers can be constructed in like manner.

Connecting wires may be soft-soldered directly to the films of nickel-chromium, copper, etc., coated on the insulating paper, foil, or plate bases.

It is envisaged that printed circuits of this type on foil bases will be rolled or folded and encased in some form of plastic material, wire leads being brought out from the whole for connection purposes.

The choice of material constituting the insulating base is important as the methods of manufacture of the printed circuit and the conditions encountered during service require it to have the following properties:

(*a*) The surface must be smooth and unbroken so that the deposited layers will be uniformly conducting.

(*b*) The material must possess dimensional stability to prevent creep and instability of the deposited layers.

(*c*) The material must behave well in a vacuum system; for example, prolonged outgassing, decomposition, and distortion are undesirable.

(*d*) The material must be capable of forming a strong bond with the vacuum-deposited layer.

Materials that satisfy these requirements include tropical grades of paper-based Bakelite board, silicone resins, some polyester bonded glass laminates, soft soda, and hard borosilicate glasses, a substance known by the name of "Araldite," and, for roll coating techniques, paper which is pre-dried and treated with a protective lacquer before and after vacuum coating.

What I claim is:

1. A method of manufacturing printed circuits consisting in printing a first negative mask on to an insulating backing so as to leave exposed unmasked areas of the backing, applying a first coating of material having a relatively low conductivity over said mask and backing so as to adhere to said unmasked areas, printing a second negative mask so as to leave exposed selected unmasked areas of said first coating, applying a second coating of relatively high conductivity over said masks and said first coating so as to adhere to the unmasked areas of said first coating, and finally chemically removing both first and second masks together with any overlying portions of the first and second coatings.

2. A method of manufacturing printed circuits including conductors and resistors consisting in printing a first negative mask on to an insulating backing so as to leave exposed unmasked area of the backing, applying a first coating of resistor material over said mask and backing so as to adhere to said unmasked areas, printing a second negative mask so as to leave exposed selected unmasked areas of said first coating, applying a second coating of conductor material over said masks and said first coating so as to adhere to the unmasked areas of said first coating, and finally removing the first and second masks together with any overlying portions of said first and second coatings by dissolution in a solvent.

3. A method of manufacturing printed circuits including conductors and resistors consisting in printing a first negative mask on to an insulating backing so as to leave exposed unmasked areas of the backing, applying a coating of nickel chrome over said mask and backing so as to adhere to said unmasked areas, printing a second negative mask so as to leave exposed selected unmasked areas of said nickel chrome coating, applying a second coating of conductive material over said masks and said nickel chrome coating so as to adhere to the unmasked areas of said nickel chrome coating, and finally removing both first and second masks together with any overlying portions of said nickel chrome and conductive coatings by dissolution in a solvent.

4. A method of manufacturing printed circuits including conductors and semi-conductors consisting in printing a first negative mask on to an insulating backing so as to leave exposed unmasked areas of the backing, applying a first coating of semi-conductor material over said mask and backing so as to adhere to said unmasked areas, printing a second negative mask so as to leave exposed selected unmasked areas of said semi-conductor coating, applying a second coating of conductor material over said masks and said semi-conductor coating so as to adhere to the unmasked areas of said semi-conductor coating, and finally removing the first and second masks together with any overlying portions of said semi-conductor and conducting coatings by dissolution in a solvent.

5. A method of manufacturing printed circuits consisting in printing a first negative mask on to a silicone resin backing so as to leave exposed unmasked areas of the backing, applying a first coating of material having a relatively low conductivity over said mask and backing so as to adhere to said unmasked areas, printing a second negative mask so as to leave exposed selected unmasked areas of said first coating, applying a second coating of relatively high conductivity over said masks and said first coating so as to adhere to the unmasked areas of said first coating, and finally removing both first and second masks together with any overlying portions of said first and second coatings by dissolution in a solvent.

References Cited in the file of this patent

UNITED STATES PATENTS

| | | |
|---|---|---|
| 1,881,446 | Flanzer | Oct. 11, 1932 |
| 2,139,640 | Mall et al. | Dec. 6, 1938 |
| 2,421,759 | Pearson | June 10, 1947 |
| 2,519,785 | Okolicsanyi | Aug. 22, 1950 |
| 2,597,674 | Robbins | May 20, 1952 |
| 2,721,152 | Hopf et al. | Oct. 18, 1955 |
| 2,721,153 | Hopf et al. | Oct. 18, 1955 |
| 2,728,693 | Cado | Dec. 27, 1955 |
| 2,886,475 | McKay | May 12, 1959 |

OTHER REFERENCES

Printed Circuit Techniques, N.B.S. Circular 468, November 15, 1947, page 26 relied on.

National Bureau of Standards, "New Advances in Printed Circuits," Publication 192, November 22, 1948, pp. 18, 19 and 25–27.